United States Patent
Guyott et al.

(10) Patent No.: US 9,671,999 B2
(45) Date of Patent: Jun. 6, 2017

(54) METHODS AND APPARATUS FOR IMPROVING UNDERSTANDABILITY OF AUDIO CORRESPONDING TO DICTATION

(71) Applicant: Nuance Communications, Inc., Burlington, MA (US)

(72) Inventors: Marc Guyott, Reading, MA (US); David Barwell Werth, Arlington, MA (US); Matthew Mascolo, Medford, MA (US)

(73) Assignee: Nuance Communications, Inc., Burlington, MA (US)

(*) Notice: Subject to any disclaimer, the term of this patent is extended or adjusted under 35 U.S.C. 154(b) by 57 days.

(21) Appl. No.: 14/711,085

(22) Filed: May 13, 2015

(65) Prior Publication Data
US 2016/0335043 A1    Nov. 17, 2016

(51) Int. Cl.
| | |
|---|---|
| *G10L 21/00* | (2013.01) |
| *G06F 3/16* | (2006.01) |
| *H03G 5/02* | (2006.01) |
| *H03G 9/02* | (2006.01) |
| *G10L 21/0364* | (2013.01) |

(52) U.S. Cl.
CPC ............. *G06F 3/165* (2013.01); *H03G 5/025* (2013.01); *H03G 9/025* (2013.01); *G10L 21/0364* (2013.01)

(58) Field of Classification Search
CPC .... H04N 1/2112; H04N 1/2158; H04N 5/772; H04N 1/32122; H04N 5/775
USPC .................. 704/225, 270; 379/75; 369/25.01
See application file for complete search history.

(56) References Cited

U.S. PATENT DOCUMENTS 7,274,775 B1 * 9/2007 Zavaliagkos ......... H04M 3/533
369/25.01

* cited by examiner

*Primary Examiner* — Charlotte M Baker
(74) *Attorney, Agent, or Firm* — Wolf, Greenfield & Sacks, P.C.

(57) ABSTRACT

According to some aspects, a method for improving understandability of audio corresponding to dictation to assist a transcriptionist in transcribing the dictation is provided. The method comprises presenting a user interface to the transcriptionist, the user interface including at least one control that can be selectively set to one of a plurality of settings, receiving a selection of one of the plurality of settings via the at least one control, and compressing a dynamic range of at least a portion of the audio using at least one parameter value associated with the selected setting.

20 Claims, 7 Drawing Sheets

METHODS AND APPARATUS FOR IMPROVING UNDERSTANDABILITY OF AUDIO CORRESPONDING TO DICTATION

BACKGROUND

Dictation systems that capture speech input from a user for subsequent transcription are widely used to facilitate data entry in a variety of industries, including the health care, legal and media industries. For example, in the health care field, doctors and other medical professionals often dictate notes regarding patients in response to a patient encounter such as a patient visit, a medical procedure performed on the patient, diagnostic analysis of patient data, etc. As another example, an attorney may dictate a memorandum or a brief (or a portion thereof) to be added to the appropriate electronic record for the associated legal matter. Independent of the field of endeavor, the dictation, once captured, is then typically transcribed (e.g., by a human transcriptionist, using automatic speech recognition, or a combination of both) and entered into or otherwise associated with the corresponding electronic record.

Special purpose transcription services have been developed and deployed that allow a user to call-up the service and begin dictating. For example, when a physician completes an interaction with a patient, the physician can call the transcription service and begin dictating information about the interaction with the patient to be stored in an electronic record associated with the patient. The audio received by the transcription service may be accessed by a transcriptionist who listens to the audio and transcribes the audio into text. Some transcription services utilize automatic speech recognition (ASR) to automatically transcribe the audio. When ASR is used, a transcriptionist is often still employed to review the automated transcription to correct any errors that may have resulted.

Such transcription services presently allow a user to call-in from any number of different devices, including land lines and mobile devices such as cellular telephones. Thus, audio received by a dictation service may originate from a wide variety of sources and may be dictated in different environmental contexts, and therefore may vary greatly in quality.

SUMMARY

Some embodiments include a system for improving understandability of audio corresponding to dictation to assist a transcriptionist in transcribing the dictation. The system may comprise at least one processor, which may be configured to: present a user interface to the transcriptionist, the user interface including at least one control that can be selectively set to one of a plurality of settings; receive a selection of one of the plurality of settings via the at least one control; and compress a dynamic range of at least a portion of the audio using at least one parameter value associated with the selected setting.

Some embodiments include a method for improving understandability of audio corresponding to dictation to assist a transcriptionist in transcribing the dictation. The method may comprise: presenting a user interface to the transcriptionist, the user interface including at least one control that can be selectively set to one of a plurality of settings; receiving a selection of one of the plurality of settings via the at least one control; and compressing a dynamic range of at least a portion of the audio using at least one parameter value associated with the selected setting.

Some embodiments include at least one computer readable medium storing instructions that, when executed by at least one processor, performs a method for improving understandability of audio corresponding to dictation to assist a transcriptionist in transcribing the dictation. The method may comprise: presenting a user interface to the transcriptionist, the user interface including at least one control that can be selectively set to one of a plurality of settings; receiving a selection of one of the plurality of settings via the at least one control; and compressing a dynamic range of at least a portion of the audio using at least one parameter value associated with the selected setting.

Some embodiments include a system for improving understandability of audio corresponding to dictation to assist a transcriptionist in transcribing the dictation. The system may comprise at least one processor, which may be configured to: present a user interface to the transcriptionist, the user interface including at least one control that can be selectively set to one of a plurality of settings; receive a selection of one of the plurality of settings via the at least one control; and equalize at least a portion of the audio using at least one parameter value associated with the selected setting.

Some embodiments include a method for improving understandability of audio corresponding to dictation to assist a transcriptionist in transcribing the dictation. The method may comprise: presenting a user interface to the transcriptionist, the user interface including at least one control that can be selectively set to one of a plurality of settings; receiving a selection of one of the plurality of settings via the at least one control; and equalizing at least a portion of the audio using at least one parameter value associated with the selected setting.

Some embodiments include at least one computer readable medium storing instructions that, when executed by at least one processor, performs a method for improving understandability of audio corresponding to dictation to assist a transcriptionist in transcribing the dictation. The method may comprise: presenting a user interface to the transcriptionist, the user interface including at least one control that can be selectively set to one of a plurality of settings; receiving a selection of one of the plurality of settings via the at least one control; and equalizing at least a portion of the audio using at least one parameter value associated with the selected setting.

BRIEF DESCRIPTION OF THE DRAWINGS

Various aspects and embodiments of the application will be described with reference to the following figures.

DETAILED DESCRIPTION

Figure 1:
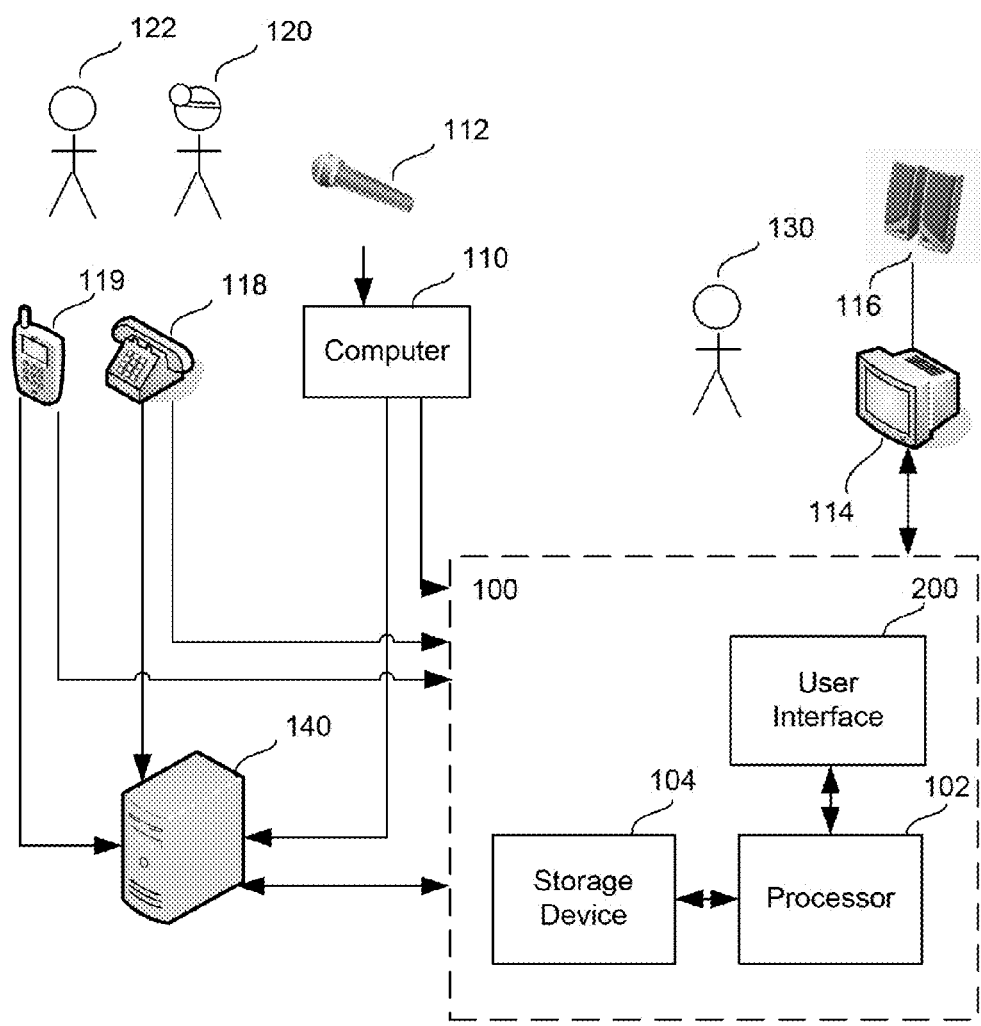
FIG. 1 is a block diagram of an exemplary operating environment for an exemplary system in accordance with some embodiments.

As discussed above, transcription services are available to receive audio dictation from a user (e.g., a clinician, legal professional, journalist, etc.), which dictation is subsequently transcribed, either by a transcriptionist, or by ASR and then reviewed by a transcriptionist. The audio dictation received may have been produced under a variety of circumstances, including poor telecommunication connections, noisy environments and/or dictated by users on the move or otherwise distracted, resulting in speech of varying quality, volume and fidelity. Thus, the resulting audio may be difficult to understand, making it challenging for a transcriptionist (or ASR) to faithfully transcribe the dictation.

Conventional transcription services may present to the transcriptionist volume control that provides the transcriptionist the ability to adjust the volume of the audio in the hope of better ascertaining the speech content of the audio. However, adjusting the volume improves understandability in relatively few circumstances because noise levels are simultaneously increased or decreased with the corresponding change in volume. Thus, volume control may be unsatisfactory in addressing the problem of understanding speech content in low quality, noisy or otherwise challenging audio dictation.

The inventors have identified techniques that can be used to improve the understandability of speech in an audio dictation by using one or more audio processing algorithms to manipulate the audio, including using audio compression and/or equalization techniques. However, such techniques are relatively complex (e.g., are not intuitive to the lay user and often operate using numerous unfamiliar parameters that govern the effect of the algorithm) and their use in improving audio quality is far from straightforward, particularly from the perspective of a transcriptionist. As a result, manipulating these algorithms is not useful in the transcription context as it is generally too complicated and time consuming for those that are not experts or otherwise knowledgeable and/or trained in audio processing.

The inventors have recognized and understood that by providing a simple interface to a transcriptionist, the complexity of the underlying techniques can be hidden, allowing transcriptionists to utilize these techniques to improve the understandability of an audio dictation without having to know or understand anything about the techniques themselves. According to some embodiments, an intuitive interface control is presented to a transcription that includes a number of selectable settings. The transcriptionist can manipulate the audio using an audio processing technique (e.g., compression, equalization, etc.) by selecting one of the settings on the associated control. The selected setting is used by the system to automatically set parameters of the underlying audio processing technique to appropriate values so that the transcriptionist need not know or be aware of the nature of the underlying audio processing technique.

The interface control may be any control that allows a user to select among a plurality of settings. As a few non-limiting examples, a control may include a slider, dial, radio buttons, menus, check-boxes, and/or any other suitable interface control that allows a transcriptionist to select one of a number of settings (preferably, though not limited to, a relatively small number of settings). Each setting may include a label suggestive of the degree to which the audio will be manipulated by the underlying audio processing technique (e.g., "off," "low," "medium," "high," or "none," "weak," "strong," "very strong," etc.). However, any type of label may be used (e.g., numeric labels) or labels may be foregone altogether, as the aspects are not limited in this respect. When a setting on the control is selected, the underlying audio processing technique is used to manipulate the audio using parameter values associated with the selected setting. Thus, relatively complex audio processing techniques can be utilized by transcriptionists to improve the understandability of an audio dictation using a relatively simple and straightforward interface control.

Following below are more detailed descriptions of various concepts related to, and embodiments of, methods and apparatus for improving the understandability of speech in audio. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 illustrates an exemplary computer system within which a transcription system 100 is configured to operate to provide transcription services to users. While transcription system 100 is described below in the context of the health care field, and in particular, transcription of physician or clinician dictation, it should be appreciated that the techniques described here may be applied to a transcription service in any field of endeavor, as there are no limitations in this respect. Transcription system 100 may be used to implement techniques developed by the inventors for improving the understandability of an audio dictation, as discussed in further detail below.

In FIG. 1, computer 110 illustrates one example of a computer or computer system by which a clinician (e.g., a physician, a physician's aide, a nurse, or any other personnel involved in the evaluation and/or treatment of a patient 122 in a clinical setting) may access or otherwise interact with transcription system 100. For example, during the course of a clinical encounter with patient 122, or at some point thereafter, clinician 120 may wish to document the patient encounter. To do so, clinician 120 may dictate a spoken narration of the patient encounter, and may do so by speaking into a microphone 112 operatively connected (e.g., embedded, connected via a direct wired connection, a direct wireless connection, or via a connection through an intermediate device) to computer 110. An audio recording of the spoken dictation may then be transmitted to transcription system 100 for transcription, stored by server 140, or both.

Clinician 120 may also provide dictation to transcription system 100 and/or server 140 via telephone 118, which may be a plain old telephone service (POTS) telephone having a land line connection. Telephone 118 may provide access to transcription system 100 via a dial-up number or may provide a dedicated connection to transcription system 100 so that no dial-in number is needed. Increasingly, clinicians access transcription services via mobile devices, such as mobile device 119 illustrated in FIG. 1, which may be a cellular telephone, smart phone, or any other wireless device (e.g., a personal digital assistant (PDA), tablet computer, special purpose handheld device, etc.) that can connect to a cellular network, a wide area network (WAN) such as the internet, other suitable network, or some combination thereof.

Transcription system 100 receives the audio and typically provides functionality that allows the transcriptionist to playback the audio so that the audio can be transcribed to text. For example, audio may be played via speakers 116, which may be part of a computer system used by the transcriptionist. Many transcription systems present an interface to the transcriptionist to facilitate generally efficient and accurate transcription. For example, a transcription system may provide controls to the user that allow the user to play, pause, rewind and fast forward the audio. The user interface may also provide volume control for the audio, or even speed control.

As discussed above, some transcription systems perform ASR and then present the automatically recognized text to the transcriptionist for editing. To facilitate editing, the transcription system may display the automatically recognized text to the transcriptionist while allowing the transcriptionist to navigate the audio to confirm the accuracy of ASR. In FIG. 1, transcription system 100 includes a computer comprising a processor 102 and storage device 104 that can be programmed to provide a user interface to the user to facilitate transcription and/or editing. Processor 102 and/or storage device 104 can be configured to provide an interface implementing techniques described herein and/or to perform audio processing techniques on audio dictation, as discussed in further detail below.

As shown in FIG. 1, clinicians can provide dictation to transcription system 100 in a number of ways including, but not limited to, mobile devices such as smartphones, PDA's, tablets, etc., land line telephones, desktop computers and the like. As a result, the quality of the audio received by transcription system 100 may vary dramatically based on microphone quality, the type of communication channel, quality of a connection, etc. In addition, noise from the environment can further degrade the quality of the audio received. Mobile devices in particular can introduce a wide range of challenges including arbitrary and often noisy environments, poor connections, distracted speakers whose attention is focused elsewhere and/or who alternately talk into and away from the microphone, etc. Accordingly, audio received by a transcriptionist is often difficult to understand, impacting the transcriptionist's ability to faithfully transcribe the dictation and/or edit an ASR produced transcription.

As discussed above, the inventors have developed techniques that allow a transcriptionist to manipulate an audio dictation to improve understandability using one or more audio processing algorithms. To address the fact that, to the typical lay person, audio processing algorithms are relatively complicated, often having numerous unfamiliar parameters to set, and without any straightforward way to apply the algorithms effectively to improve the understandability of an audio diction, the inventors have developed an interface that allows the transcriptionist to utilize one or more of the audio processing algorithms without needing to understand the algorithms themselves or be aware of the type of processing that is being performed on the audio.

According to some embodiments, an interface control is provided that has a plurality of selectable settings that a transcriptionist can select. The interface control may be associated with a particular audio processing algorithm, or multiple audio processing algorithms (e.g., a dynamic range compression algorithm, an equalization algorithm, or both). Each setting may have an associated set of parameter values that, when the respective setting is selected, are automatically set for the respective audio processing algorithm in processing audio. In this way, the transcriptionist need not know anything about the underlying audio processing algorithm, what parameters the algorithm utilizes or what effect those parameters have on the audio processing. Instead, the transcriptionist simply selects one of the plurality of settings and the appropriate parameter values for the associated audio processing algorithm(s) are automatically set and utilized.

When enabled, the one or more audio processing algorithms can begin to process the audio at whatever portion of the audio the transcriptionist is currently playing back. Since, in some embodiments, the associated audio processing algorithm operates in real-time, or substantially in real-time, from the perspective of the listener, the transcriptionist can hear the effect a given setting has on the understandability of the audio dictation. Thus, the transcriptionist can dynamically change the setting until the audio processing has a desired effect on the audio and/or the best results are achieved. It should be appreciated that any control may be provided to the transcriptionist that allows for different settings to be selected including, but not limited to, sliders, dials, buttons, pull-down menus, check boxes, radio buttons, flyovers, etc.

Figure 2:
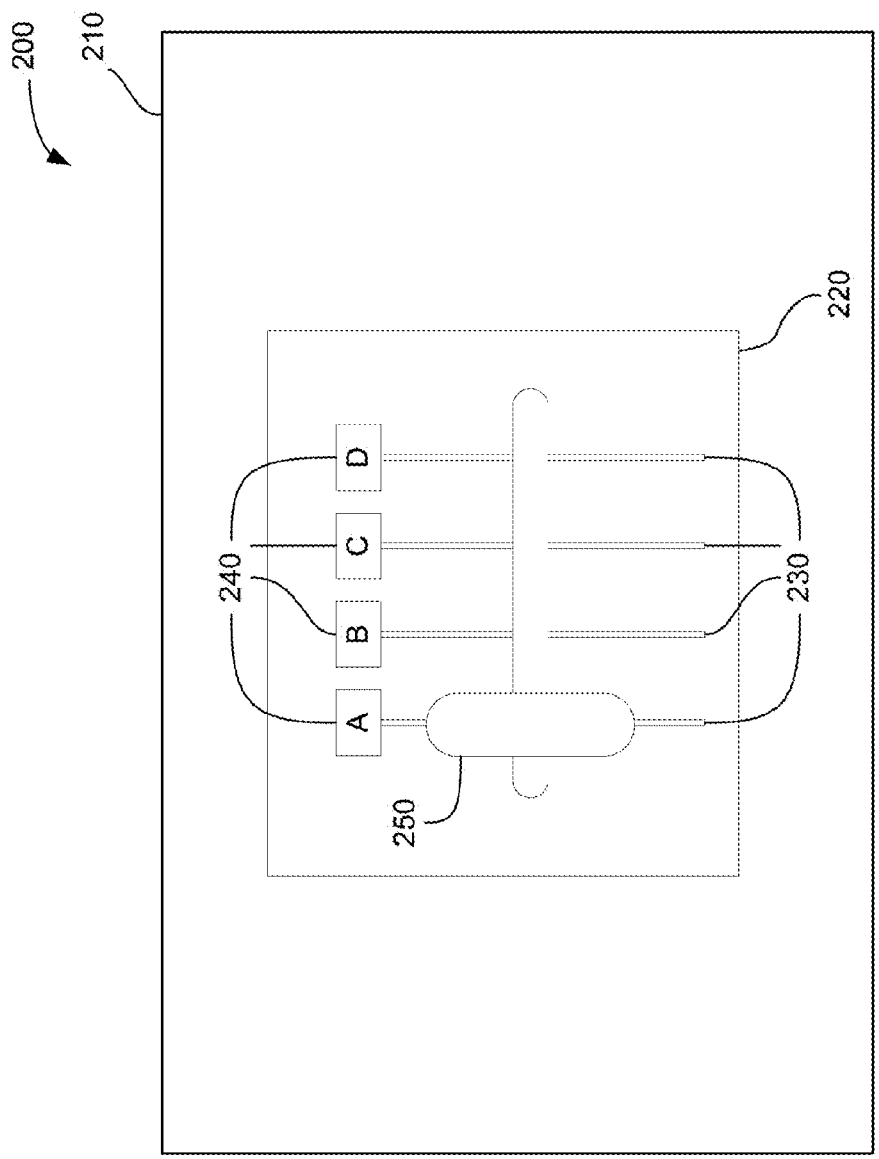
FIG. 2 is a diagram of an exemplary user interface in accordance with some embodiments.

FIG. 2 illustrates one exemplary control suitable for use in implementing techniques developed by the inventors to facilitate improving the understandability of audio dictations. Interface 200 may be a graphical user interface (GUI) for display on a display device (e.g., user interface 200 illustrated in FIG. 1 that can be displayed on computer 114), and can be a standalone interface or provided with an existing interface that the transcriptionist uses to transcribe received audio (e.g., incorporated into an audio playback interface). Interface 200 includes a control 220 associated with at least one audio processing algorithm.

In this example, control 220 includes a slider 250 that can be positioned in one of a plurality of settings 230. Each setting (except an "off" setting if present) is associated with one or more parameter values that are automatically set for the associated audio processing algorithm when a transcriptionist positions slider 250 to the respective setting. Thus, a transcriptionist can select one of the settings via slider 250 and the associated audio processing algorithm(s) will process the audio or a portion of the audio using the one or more parameter values associated with the selected setting. The one or more parameter values associated with each setting will depend on the type and variety of the audio processing algorithm used, some examples of which are discussed in further detail below.

Each setting 230 may further include a label 240 that provides an intuitive description of the respective setting. According to some embodiments, the labels are suggestive of the amount or degree to which the associated audio processing algorithm will manipulate the audio. For example, exemplary labels 240 indicate that the respective settings correspond to "off," "low," "medium," "high," etc. As another example, labels 240 may indicate that the respective settings correspond to "off," "weak," "medium," "strong," "very strong," etc. Numerical labels can also be used such as "1," "2," "3," etc. It should be appreciated that labels are not required and in some embodiments are not used. However, labels can be used as an effective way to indicate to the transcriptionist how the settings relate and generally what degree of effect should be expected. According to some embodiments, the labels may correspond to a parameter and/or parameter value being set by the respective setting (e.g., a gain value, frequency value, threshold value, etc., as discussed in further detail below), in instances where doing so is deemed not unduly confusing for the transcriptionist.

In FIG. 2, interface 200 is a software implemented interface presented to the transcriptionist, for example, via a display. According to some embodiments, the interface can also be a hardware interface including physical sliders, dials, buttons, switches, etc., as the techniques described herein are not limited for use with any particular software and/or hardware solution.

As discussed above, the inventors have recognized that certain audio processing algorithms can be used to improve the understandability of an audio dictation, either alone or in combination. In particular, the inventors have recognized that compression algorithms that compress the dynamic range of audio can be used to improve understandability. In addition, the inventors have recognized that equalization algorithms can also be used to improve the understandability of an audio dictation. These two exemplary audio processing algorithms are discussed in further detail below.

As discussed above, conventional transcription services often include volume control for the transcriptionist. However, the inventors have recognized that volume control is significantly limited in improving the understandability of an audio dictation because volume control increases the volume of speech, but also increases the volume of the noise. As a result, volume control frequently does little if anything to improve understandability. The inventors have appreciated that dynamic range compression can be used to boost speech relative to other audio components such as noise to improve the understandability of the compressed audio dictation or portion thereof.

Generally speaking, however, compression algorithms are relatively unintuitive, often operating on multiple unfamiliar parameters whose effect on audio may not be understood, particularly by the typical transcriptionist. Without expert knowledge, these compression algorithms are confusing and therefore are of little direct use to a transcriptionist. The inventors have addressed this issue by identifying parameter values for compression suitable for manipulating audio to improve understandability. These parameter values, once identified, can be associated with settings provided in connection with an interface control presented to the transcriptionist. Thereafter, the transcriptionist need only select a setting and the associated parameter value(s) will be automatically used to compress the audio dictation or a portion of the audio dictation, as discussed in further detail in connection with FIG. 3.

Figure 3:
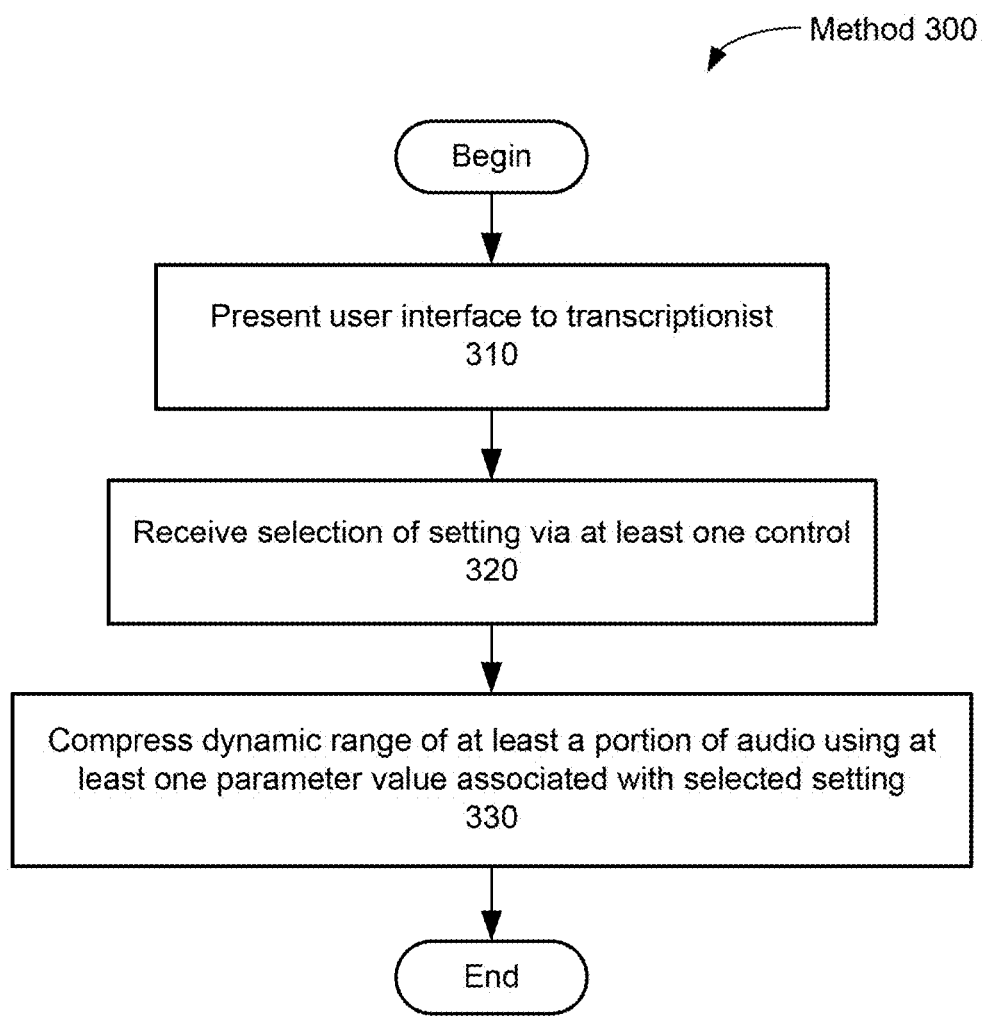
FIG. 3 is a flowchart illustrating an exemplary method for improving understandability of audio corresponding to dictation, in accordance with some embodiments.

FIG. 3 illustrates a method of providing an interface to a transcriptionist that allows the transcriptionist to manipulate audio using a compression algorithm to facilitate improved understandability of an audio dictation, in accordance with some embodiments. In act 310, a user interface is presented to a transcriptionist to facilitate transcribing and/or editing an automatic transcription of an audio dictation. The user interface includes a control associated with a compression algorithm. The control includes a plurality of selectable settings that a transcriptionist can manipulate to change the current setting of the at least one control. Each of the selectable settings has an associated set of parameter values (i.e., one or more) that, when the respective setting is selected, is applied to the compression algorithm to manipulate at least a portion of the audio dictation.

In act 320, a selection of one of the selectable settings is received via the interface control. For example, a transcriptionist may manipulate the control to select a desired setting for manipulating an audio dictation that is difficult to understand. The selection of a setting establishes how the compression algorithm will process the audio dictation or a portion thereof. In particular, in act 330, the dynamic range of at least a portion of the audio dictation is compressed using the set of parameters associated with the selected setting. Referring back to FIGS. 1 and 2, the presented user interface may be of the type described in connection with user interface 200. The compression algorithm may be performed, for example, using an appropriately configured processor 102 and storage device 104 of transcription service 100.

It should be appreciated that the above described techniques allow for the complexity of the compression algorithm to be understood and exploited by those having appropriate knowledge and understanding so that a transcriptionist need not. In particular, these techniques allow for those knowledgeable about compression techniques to identify parameter values that tend to improve the understandability of audio dictation and associate them with settings (preferably, though not necessarily, a relatively small number of settings), so that a transcriptionist can benefit from the improvement in understandability without having to understand the underlying compression algorithm, how it operates, or what parameter values the algorithm uses.

Figure 4:
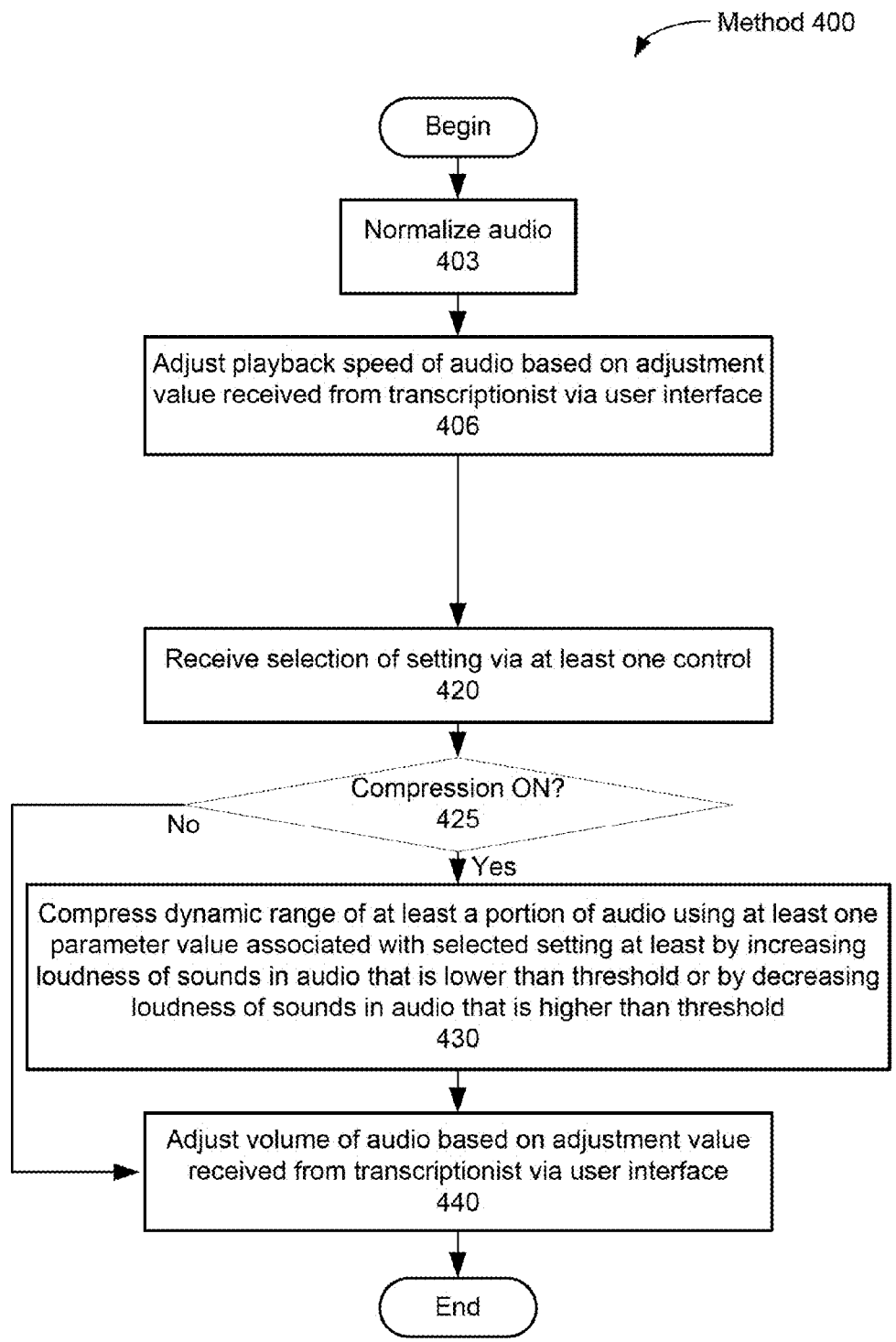
FIG. 4 is a flowchart illustrating an additional exemplary method for improving understandability of audio corresponding to dictation, in accordance with some embodiments.

FIG. 4 illustrates an exemplary workflow that may result from a transcriptionist listening to an audio dictation and endeavoring to improve the understandability to better ascertain the speech content. In act 403, prior to compressing the dynamic range of the audio, the audio dictation may be normalized. In act 406, an adjustment value for a playback speed of the audio may be received from a transcriptionist (e.g., transcriptionist 130) via a user interface (e.g., user interface 200) and the playback speed of the audio may be adjusted based on the adjustment value. For example, the transcriptionist might decide to slow down the playback speed to better ascertain the speech content of the audio dictation.

In act 420, a selection of one of the multiple settings may be received via the at least one control, and in act 425, it is determined whether dynamic range compression is on or active, which activation may be achieved via the settings providing on the interface control. For example, the received setting may be the transcriptionist turning off compression for the audio dictation. If it is determined that dynamic range compression is not on/active no compression is performed and the audio dictation may be played back to the transcriptionist at the speed selected without compression.

If it is determined that dynamic range compression is on/active, a dynamic range of at least a portion of the audio dictation may be compressed using the set of parameter values associated with the selected setting in act 430, as discussed above in connection with FIG. 3. According to some embodiments, at least one parameter value set by the selected setting is a gain value that indicates a threshold (e.g., in decibels) used by the compression algorithm to increase the loudness of sounds in the audio that are lower than the threshold and/or decrease a loudness of sounds in the audio that are higher than the threshold. In this way, at least one parameter value can vary the threshold level about which compression is performed, either in an upward or downward fashion. According to some embodiments, multiple parameters values are set upon selection of one of the settings on the interface control.

In act 440, an adjustment value for the volume of the audio may be received from the transcriptionist via the user interface, and the volume of the audio may be adjusted based on the adjustment value. This process may be repeated per further input from the transcriptionist, for example, as the transcriptionist selects a different setting, changes the playback speed and/or changes the volume. It should be further appreciated that the order in which the acts described above will depend on the order in which input via the user interface is received from the transcriptionist, and the order illustrated in merely by way of example.

There exist numerous audio compression techniques that are suitable for use in implementing the techniques described herein. Each compression technique may have its own set of parameters used to perform compression so that the set of parameter values associated with the selectable setting of the interface control may also differ depending on the particular audio compression algorithm used. Provided below is a description of an exemplary compression algorithm suitable for use in improving the understandability of an audio dictation, as well as the description of the parameters and parameter values associated with exemplary settings of a user interface control. However, it should be appreciated that any given algorithm may have a different set of operating parameters and parameter values. In addition, algorithms that utilize one or more of the same general parameters may have different optimal values with respect to improving the understandability of an audio dictation.

The exemplary compression algorithm discussed below includes parameters for threshold, ratio, gain, attack time, release time and mix. Setting these parameters to different values has different effects on the audio being processed. The inventors have ascertained parameter values that tend to improve the understandability of an audio dictation and have associated these parameter values with respective settings of an interface control to allow a transcriptionist to utilize the compression algorithm without having to understand the parameters or know what are and are not appropriate parameter values that will increase the understandability of an audio dictation. That is, the inventors have identified parameter values that are optimal in some sense and have associated these parameter values with respective settings on an interface control for simplified use of the compression algorithm by a transcriptionist.

Table 1 below lists identified set of parameter values for the above listed parameters of the exemplary compression algorithm and the respective setting to which each are associated.

TABLE 1

|  | Gain | Threshold | Ratio | Attack Time | Release Time | Mix |
| --- | --- | --- | --- | --- | --- | --- |
| Off | NA | NA | NA | NA | NA | NA |
| Low | 4 dB | −9 dB | 20:1 | 20 μsec | 250 msec | 100% |
| Medium | 7 dB | −9 dB | 20:1 | 20 μsec | 250 msec | 100% |
| High | 10 dB | −9 dB | 20:1 | 20 μsec | 250 msec | 100% |

In this exemplary embodiment, four settings are provided: Off; Low; Medium; and High. As illustrated, when "Off" is selected the parameter values are not applicable as compression is not being performed. Each of the remaining settings (Low, Medium and High) for which compression is performed has an associated gain value that is set when the corresponding setting is selected by a transcriptionist. This gain value provides a threshold value that governs which sounds are amplified and/or suppressed. In this embodiment, the remaining parameters are all set to the same parameter value for each setting. However, according to some embodiments, one or more of these other parameters vary depending on the setting. As discussed above, the compression algorithm having these parameters and parameter values is merely exemplary, and the techniques described herein are not limited to any particular set of parameters or parameter values. Different compression algorithms may include different, additional or fewer parameters, and these parameters may take on any suitable values in association with any number of settings, as the techniques described herein are not limited in this respect.

As discussed above, the inventors have also appreciated that audio equalization may be used to improve the understandability of an audio dictation. For example, equalization can be used to reduce the effect of certain background noise on the quality and clarity of the audio and improve a transcriptionist's ability to ascertain the speech content in an audio dictation. Audio equalization is a technique that adjusts the amplitudes of audio signals at particular frequencies and can be used to suppress background noise while maintaining or even enhancing speech.

Similar to the issues discussed above, equalization algorithms are also relatively unintuitive, often operating on numerous unfamiliar parameters that impact the equalization in different ways that are not well understood by the typical lay person. Without knowledge of how altering certain frequencies (e.g., across the spectrum from low bass to high treble) effect audio, these equalization algorithms are confusing and of little direct use to a transcriptionist. The inventors have addressed this issue by identifying parameter values for equalization suitable for manipulating audio to improve understandability. These parameter values, once identified, can be associated with settings provided in connection with an interface control presented to the transcriptionist. Thereafter, the transcriptionist need only select a setting and the associated parameter value(s) will be automatically used to equalize the audio dictation or a portion of the audio dictation, as discussed in further detail in connection with FIG. 5.

Figure 5:
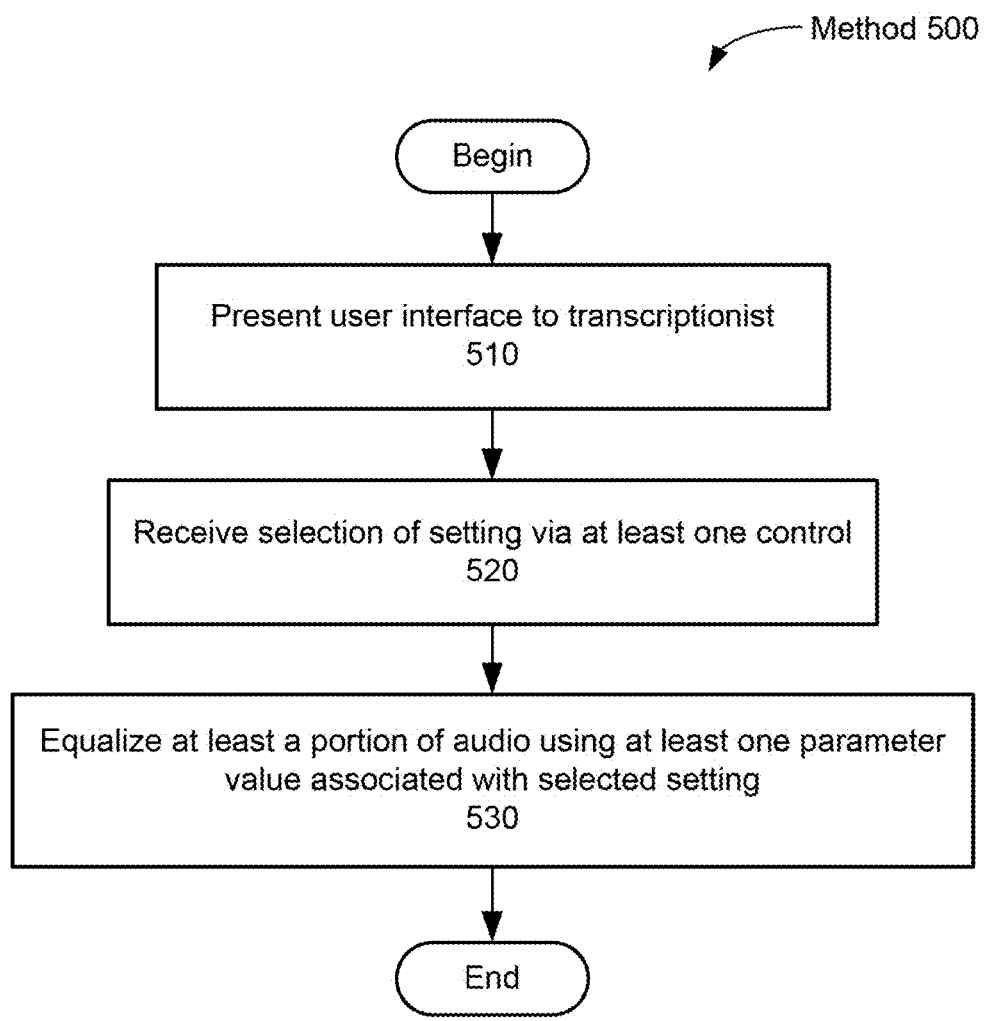
FIG. 5 is a flowchart illustrating an exemplary method for improving understandability of audio corresponding to dictation, in accordance with some embodiments.

FIG. 5 illustrates a method of providing an interface to a transcriptionist that allows the transcriptionist to manipulate audio using an equalization algorithm to facilitate improved understandability of an audio dictation, in accordance with some embodiments. In act 510, a user interface is presented to a transcriptionist to facilitate transcribing and/or editing an automatic transcription of an audio dictation. The user interface includes a control associated with an equalization algorithm that includes a plurality of selectable settings that a transcriptionist can manipulate to change the current setting of the at least one control. Each of the selectable settings has an associated set of parameter values that, when the respective setting is selected, is applied to the equalization algorithm to manipulate the audio.

In act 520, a selection of one of the selectable settings is received via the interface control. For example, a transcriptionist may manipulate the control to select a desired setting for manipulating an audio dictation that presents a challenge to ascertaining the speech content of the audio dictation. The selection of a setting establishes how the equalization algorithm will process the audio dictation or a portion thereof. In particular, in act 530, at least a portion of the audio dictation is equalized using the set of parameters associated with the selected setting. Referring back to FIGS. 1 and 2, the presented user interface may be of the type described in connection with user interface 200. The equalization algorithm may be performed, for example, using and appropriately programmed processor 102 and storage device 104 of transcription service 100.

It should be appreciated that the above described techniques allow for the complexity of the equalization algorithm to be understood and exploited by those having appropriate knowledge and understanding and thereafter hidden from the transcriptionist. In particular, these techniques allow for those knowledgeable about equalization to identify parameter values that tend to improve the understandability of audio dictation (e.g., by suppressing frequencies associated with noise, while maintaining or enhancing frequencies associated with speech) and associate the identified parameter values with settings of an interface control (preferably, though not necessarily, a relatively small number of settings) so that a transcriptionist can benefit from the improvement in understandability without having to understand the underlying equalization algorithm, how it operates, and/or what parameter values are being set.

Figure 6:
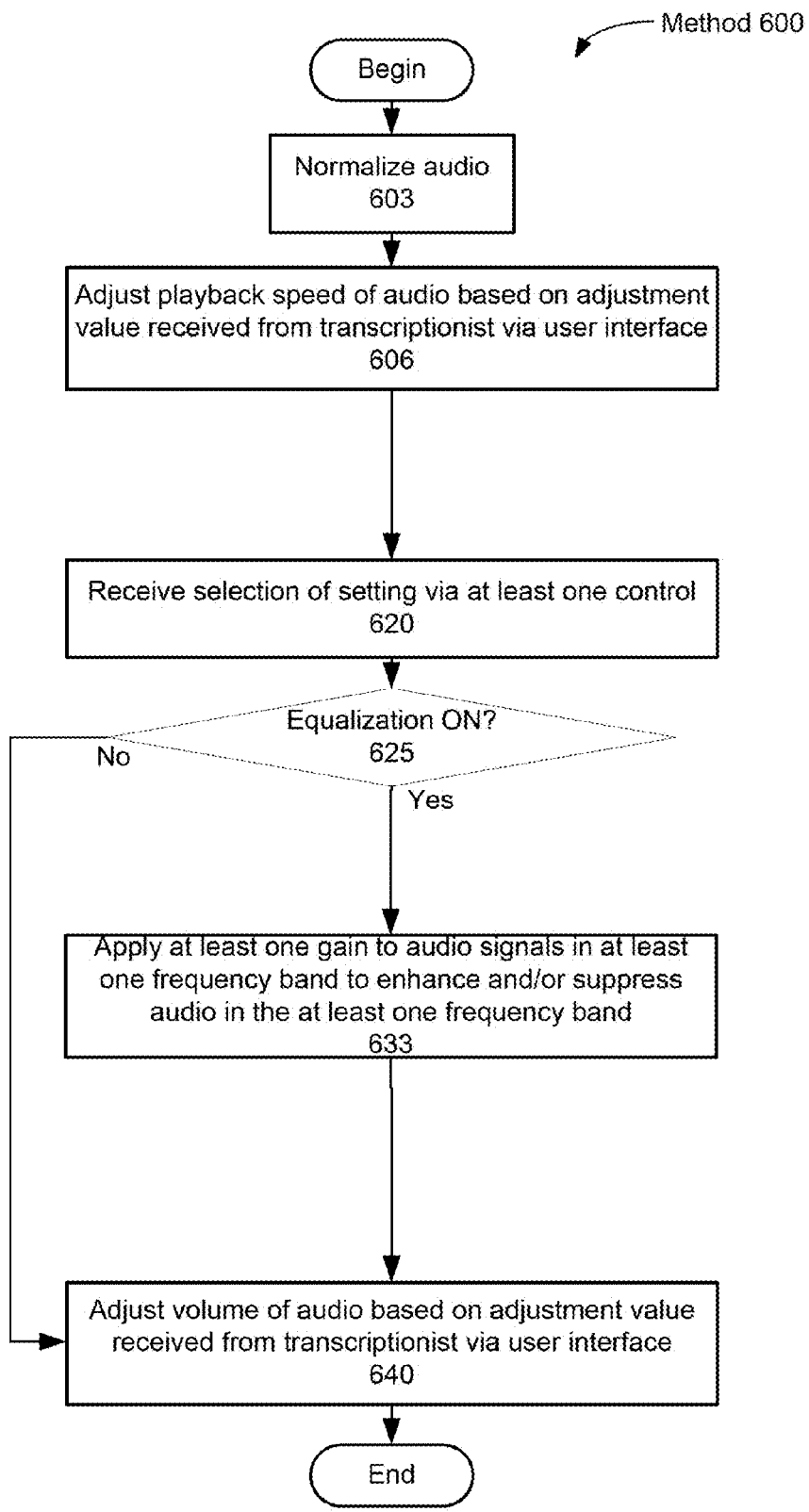
FIG. 6 is a flowchart illustrating an additional exemplary method for improving understandability of audio corresponding to dictation, in accordance with some embodiments.

FIG. 6 illustrates an exemplary workflow that may result from a transcriptionist listening to an audio dictation and endeavoring to improve the understandability of the audio dictation. Acts 603 and 606 may be similar to the corresponding acts in FIG. 4. In particular, in act 603, prior to equalizing the audio, the audio dictation may be normalized. In act 606, an adjustment value for a playback speed of the audio may be received from a transcriptionist (e.g., transcriptionist 130) via a user interface (e.g., user interface 200) and the playback speed of the audio may be adjusted based on the adjustment value. For example, the transcriptionist might decide to slow down the playback speed to better ascertain the speech content of the audio dictation.

In act 620, a selection of one of the multiple settings may be received via the at least one control, and in act 625, it is determined whether equalization is on or off. For example, the received setting may be the transcriptionist turning off equalization for the audio dictation, or selecting a setting that engages equalization. If it is determined that equalization is off, no equalization is performed and the audio dictation may be played back to the transcriptionist at the speed selected without equalization.

If it is determined that equalization is on/active, at least a portion of the audio may be equalized using the set of parameter values associated with the selected setting (act 630), as discussed above in connection with FIG. 5. According to some embodiments, the set of parameter values includes a gain to be applied to at least one frequency band. For example, the gain may be applied to amplify or suppress audio signals in the given frequency band. The frequency band may be defined by one or more threshold frequency values. According to some embodiments, the set of parameter values includes at least on threshold frequency value so as to vary the frequency band to which the gain is applied depending on the setting that is selected. According to some embodiments, at least one set of parameter values includes a first gain to amplify audio in a first frequency band and a second gain to suppress audio in a second frequency band. In act 633, at least one gain is applied to at least one frequency band in order to enhance and/or suppress audio signals accordingly.

In act 640, an adjustment value for the volume of the audio may be received from the transcriptionist via the user interface, and the volume of the audio may be adjusted based on the adjustment value. According to some embodiments, when equalization is off, volume adjustments from the transcriptionist are applied as is, while when equalization is on, the volume adjustment may be modified, for example, scaled down by a predetermined amount (e.g., divided by two). In other embodiments, volume adjustments may be treated the same both when equalization is on and off, as aspects that utilize volume control are not limited in this respect. This process may be repeated per further input from the transcriptionist, for example, as the transcriptionist selects a different setting, changes the playback speed and/or changes the volume. It should be further appreciated that the order in which the acts described above will depend on the order in which input via the user interface is received from the transcriptionist.

As with compression, there exist numerous equalization algorithms that are suitable for use with the above described techniques. Each equalization algorithm may have its own set of operational parameters so that the set of parameter values associated with the respective settings of an interface control may also differ depending on the particular equalization algorithm used. Provided below is a description of an exemplary equalization algorithm suitable for use in improving the understandability of an audio dictation, as well as the description of the parameters and parameter values associated with exemplary settings of a user interface control that the inventors have determined facilitate improving understandability of audio dictation. However, it should be appreciated that any given algorithm may have a different set of operating parameters and parameter values. In addition, algorithms that utilize one or more of the same general parameters may have different optimal values with respect to improving the understandability of an audio dictation.

The exemplary equalization algorithm discussed below includes parameters for low drive percentage, low gain, mid drive percentage, mid gain, high drive percentage, high gain, low-mid frequency and mid-high frequency. Setting these parameters to different values has different effects on the audio being processed. The inventors have identified sets of parameter values that tend to improve the understandability of an audio dictation and have associated these parameter values with respective settings of an interface control to allow a transcriptionist to utilize the equalization algorithm without having to understand the nature of the parameters or what are appropriate parameter values with respect to achieving increased understandability of an audio dictation. That is, the inventors have identified parameter values that are optimal in some sense and have associated these parameter values with respective settings on an interface control for simplified use of the equalization algorithm by a transcriptionist.

Table 2 below lists the parameter values for the above listed parameters of the exemplary equalization algorithm that are associated with the exemplary interface control settings, in accordance with some embodiments.

TABLE 2

|  | Mid-High Frequency | Low-Mid Frequency | Low Gain | Mid Gain | High Gain | Low Drive % | Mid Drive % | High Drive % |
|---|---|---|---|---|---|---|---|---|
| Off | NA | NA | NA | NA | NA | NA | NA | NA |
| Setting 1 | 850 Hz | 240 | 0 | 0 dB | −60 dB | 100 | 100 | 100 |
| Setting 2 | 1200 Hz | 240 | 0 | 0 dB | −60 dB | 100 | 100 | 100 |
| Setting 3 | 2000 Hz | 240 | 0 | 0 dB | −60 dB | 100 | 100 | 100 |
| Setting 3 | 2700 Hz | 240 | 0 | 0 dB | −60 dB | 100 | 100 | 100 |

In this exemplary embodiment, five settings are provided: Off; and Settings 1-4. As illustrated, when "Off" is selected the parameter values are not applicable as equalization is not being performed. Each of the remaining settings 1-4 for which equalization is performed has an associated mid-high frequency value that is set when the corresponding setting is selected by a transcriptionist. This value dictates the bounds of the frequencies that are adjusted, for example, suppressed by the high gain parameter value (e.g., −60 dB). In this embodiment, the remaining parameters are all set to the same parameter value for each setting for which equalization is on/active, based on the inventors' insight that some of these parameters have little impact on either noise suppression and/or speech enhancement.

However, according to some embodiments, one or more other parameters vary depending on the setting selected. For example, both frequency thresholds (mid-high and low-mid) could vary depending on the setting and/or the gains (low gain, mid gain and high gain) for each frequency band could vary depending on the selected setting. Other parameter values could also vary depending on the setting selected, as the aspects are not limited to any particular choice of parameter or parameter value. As discussed above, the equalization algorithm having the above listed parameters and parameter values is merely exemplary, and the techniques described herein are not limited to any particular set of parameters or parameter values. Different equalization algorithms may include different, additional or fewer parameters, and these parameters may take on any suitable values in association with any number of settings, as the techniques described herein are not limited in this respect.

It should be appreciated that compression and equalization techniques can be used in conjunction with one another. For example, a user interface may include a control associated with a compression algorithm and a control associated with an equalization algorithm. In this way, a transcriptionist is provided with separate controls for each, providing the transcriptionist with a greater opportunity to improve the understandability of an audio dictation. Alternatively, compression and equalization may be controlled with a single control. In such embodiments, each setting would have an associated set of parameter values that includes at least one parameter value for compression and at least one parameter value for equalization. In this way, the interface may be simplified while still providing access to both audio processing algorithms.

Figure 7:
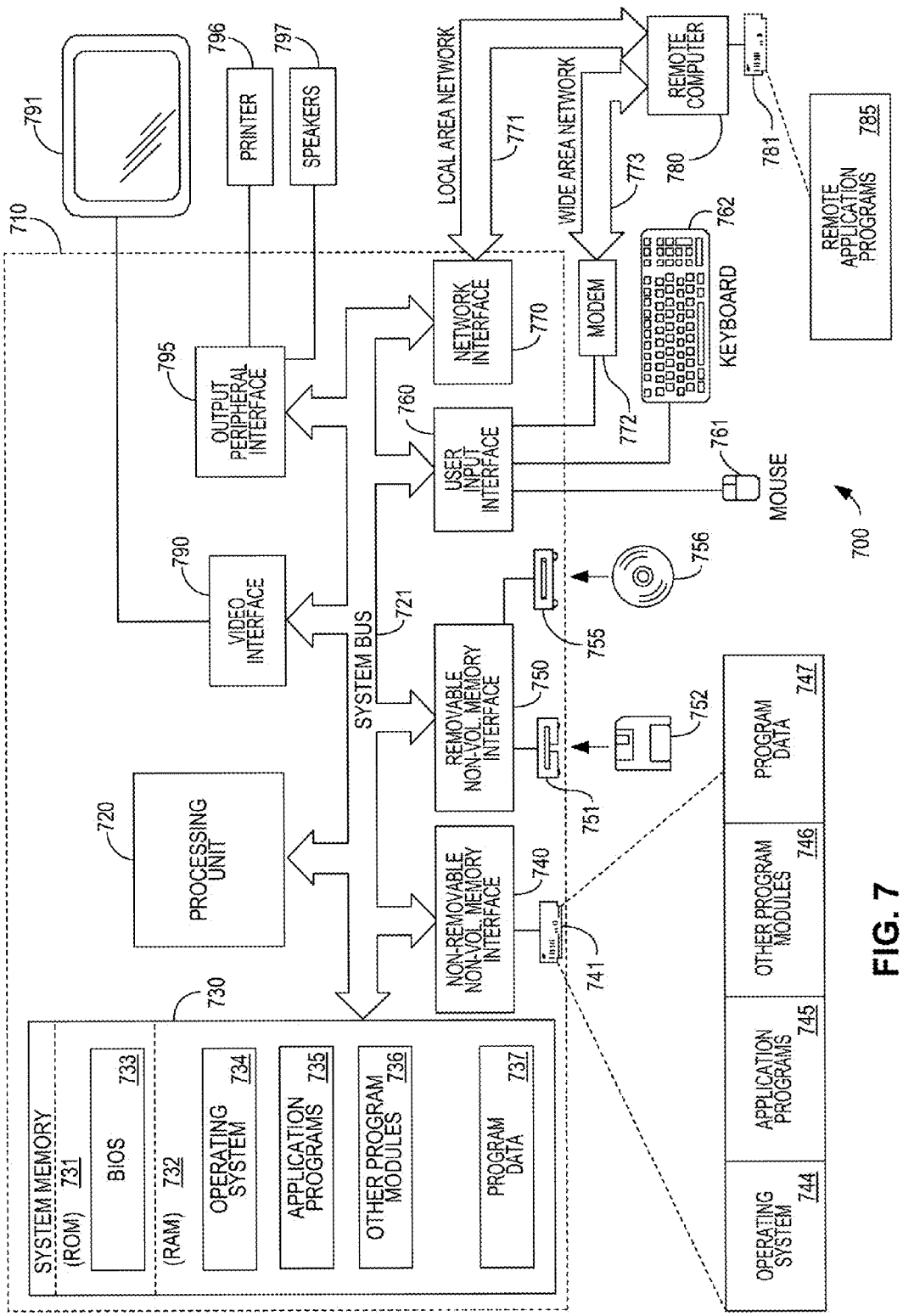
FIG. 7 is a block diagram of an exemplary computer system on which techniques described herein may be implemented, in accordance with some embodiments.

FIG. 7 illustrates an example of a suitable computing system environment 700 in which some embodiments may be implemented. This computing system may be representative of a computing system that allows a suitable control system to implement the described techniques. However, it should be appreciated that the computing system environment 700 is only one example of a suitable computing environment and is not intended to suggest any limitation as to the scope of use or functionality of the described embodiments. Neither should the computing environment 700 be interpreted as having any dependency or requirement relating to any one or combination of components illustrated in the exemplary operating environment 700.

The embodiments are operational with numerous other general purpose or special purpose computing system environments or configurations. Examples of well-known computing systems, environments, and/or configurations that may be suitable for use with the described techniques include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc., that perform particular tasks or implement particular abstract data types. The embodiments may also be practiced in distributed computing environments where tasks are performed by remote processing devices that are linked through a communications network. In a distributed computing environment, program modules may be located in both local and remote computer storage media including memory storage devices.

With reference to FIG. 7, an exemplary system for implementing the described techniques includes a general purpose computing device in the form of a computer 710. Components of computer 710 may include, but are not limited to, a processing unit 720, a system memory 730, and a system bus 721 that couples various system components including the system memory to the processing unit 720. The system bus 721 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 710 typically includes a variety of computer readable media. Computer readable media can be any available media that can be accessed by computer 710 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 710. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 730 includes computer storage media in the form of volatile and/or nonvolatile memory such as read only memory (ROM) 731 and random access memory (RAM) 732. A basic input/output system 733 (BIOS), containing the basic routines that help to transfer information between elements within computer 710, such as during start-up, is typically stored in ROM 731. RAM 732 typically contains data and/or program modules that are immediately accessible to and/or presently being operated on by processing unit 720. By way of example, and not limitation, FIG. 7 illustrates operating system 734, application programs 735, other program modules 736, and program data 737.

The computer 710 may also include other removable/non-removable, volatile/nonvolatile computer storage media. By way of example only, FIG. 7 illustrates a hard disk drive 741 that reads from or writes to non-removable, nonvolatile magnetic media, a magnetic disk drive 751 that reads from or writes to a removable, nonvolatile magnetic disk 752, and an optical disk drive 755 that reads from or writes to a removable, nonvolatile optical disk 756 such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 741 is typically connected to the system bus 721 through a non-removable memory interface such as interface 740, and magnetic disk drive 751 and optical disk drive 755 are typically connected to the system bus 721 by a removable memory interface, such as interface 750.

The drives and their associated computer storage media discussed above and illustrated in FIG. 7 provide storage of computer readable instructions, data structures, program modules and other data for the computer 710. In FIG. 7, for example, hard disk drive 741 is illustrated as storing operating system 744, application programs 745, other program modules 746, and program data 747. Note that these components can either be the same as or different from operating system 734, application programs 735, other program modules 736, and program data 737. Operating system 744, application programs 745, other program modules 746, and program data 747 are given different numbers here to illustrate that, at a minimum, they are different copies. A user may enter commands and information into the computer 710 through input devices such as a keyboard 762 and pointing device 761, commonly referred to as a mouse, trackball or touch pad. Other input devices (not shown) may include a microphone, joystick, game pad, satellite dish, scanner, touchscreen, or the like. These and other input devices are often connected to the processing unit 720 through a user input interface 760 that is coupled to the system bus, but may be connected by other interface and bus structures, such as a parallel port, game port or a universal serial bus (USB). A monitor 791 or other type of display device is also connected to the system bus 721 via an interface, such as a video interface 790. In addition to the monitor, computers may also include other peripheral output devices such as speakers 797 and printer 796, which may be connected through an output peripheral interface 795.

The computer 710 may operate in a networked environment using logical connections to one or more remote computers, such as a remote computer 780. The remote computer 780 may be a personal computer, a server, a router, a network PC, a peer device or other common network node, and typically includes many or all of the elements described above relative to the computer 710, although only a memory storage device 781 has been illustrated in FIG. 7. The logical connections depicted in FIG. 7 include a local area network (LAN) 771 and a wide area network (WAN) 773, but may also include other networks. Such networking environments are commonplace in offices, enterprise-wide computer networks, intranets and the Internet.

When used in a LAN networking environment, the computer 710 is connected to the LAN 771 through a network interface or adapter 770. When used in a WAN networking environment, the computer 710 typically includes a modem 772 or other means for establishing communications over the WAN 773, such as the Internet. The modem 772, which may be internal or external, may be connected to the system bus 721 via the user input interface 760, or other appropriate mechanism. In a networked environment, program modules depicted relative to the computer 710, or portions thereof, may be stored in the remote memory storage device. By way of example, and not limitation, FIG. 7 illustrates remote application programs 785 as residing on memory device 781. It will be appreciated that the network connections shown are exemplary and other means of establishing a communications link between the computers may be used.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

In this respect, it should be appreciated that one implementation comprises at least one processor-readable storage medium (i.e., at least one tangible, non-transitory processor-readable medium, e.g., a computer memory (e.g., hard drive, flash memory, processor working memory, etc.), a floppy disk, an optical disc, a magnetic tape, or other tangible, non-transitory processor-readable medium) encoded with a computer program (i.e., a plurality of instructions), which, when executed on one or more processors, performs at least some of the above-discussed functions, and possibly others. The processor-readable storage medium can be transportable such that the program stored thereon can be loaded onto any computer resource to implement functionality discussed herein. In addition, it should be appreciated that the reference to a computer program which, when executed, performs above-discussed functions, is not limited to an application program running on a host computer. Rather, the term "computer program" is used herein in a generic sense to reference any type of computer code (e.g., software or microcode) that can be employed to program one or more processors to implement above-discussed functionality.

The phraseology and terminology used herein is for the purpose of description and should not be regarded as limiting. The use of "including," "comprising," "having," "containing," "involving," and variations thereof, is meant to encompass the items listed thereafter and additional items. Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

Having described several embodiments of the invention, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

Processor-executable instructions may be in many forms, such as program modules, executed by one or more computers or other devices. Also, data structures may be stored in one or more non-transitory computer-readable storage media in any suitable form. For simplicity of illustration, data structures may be shown to have fields that are related through location in the data structure. Such relationships may likewise be achieved by assigning storage for the fields with locations in a non-transitory computer-readable medium that convey relationship between the fields. However, any suitable mechanism may be used to establish relationships among information in fields of a data structure, including through the use of pointers, tags or other mechanisms that establish relationships among data elements.

Also, various inventive concepts may be embodied as one or more processes, of which multiple examples have been provided. The acts performed as part of each process may be ordered in any suitable way. Accordingly, embodiments may be constructed in which acts are performed in an order different than illustrated, which may include performing some acts concurrently, even though shown as sequential acts in illustrative embodiments.

All definitions, as defined and used herein, should be understood to control over dictionary definitions, and/or ordinary meanings of the defined terms.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

Use of ordinal terms such as "first," "second," "third," etc., in the claims to modify a claim element does not by itself connote any priority, precedence, or order of one claim element over another or the temporal order in which acts of a method are performed. Such terms are used merely as labels to distinguish one claim element having a certain name from another element having a same name (but for use of the ordinal term).

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the techniques described herein in detail, various modifications, and improvements will readily occur to those skilled in the art. Such modifications and improvements are intended to be within the spirit and scope of the disclosure. Accordingly, the foregoing description is by way of example only, and is not intended as limiting. The techniques are limited only as defined by the following claims and the equivalents thereto.

What is claimed is:

1. A system for improving understandability of audio corresponding to dictation to assist a transcriptionist in transcribing the dictation, the system comprising:
at least one processor configured to:
present a user interface to the transcriptionist, the user interface including at least one control that can be selectively set to one of a plurality of settings;
receive a selection of one of the plurality of settings via the at least one control; and
compress a dynamic range of a loudness of sounds of at least a portion of the audio using at least one parameter value associated with the selected setting.

2. The system of claim 1, wherein the at least one processor is configured to compress the dynamic range of at least the portion of the audio according to a compression scheme having a plurality of parameters, and wherein the at least one parameter value is used to set at least one value for one or more of the plurality of parameters.

3. The system of claim 1, wherein each of the plurality of settings is associated with a different at least one parameter value.

4. The system of claim 1, wherein the at least one parameter value includes a gain value.

5. The system of claim 4, wherein each of the plurality of settings is associated with a respective different gain value.

6. The system of claim 2, wherein each setting is associated with a respective set of parameter values corresponding respectively to the plurality of parameters of the compression scheme.

7. The system of claim 1, wherein the at least one processor is configured to compress the dynamic range of at least the portion of the audio using the at least one parameter value associated with the selected setting and at least one default parameter value.

8. The system of claim 7, wherein the compression is performed using a compression scheme having at least two parameters from a group of parameters consisting of: gain; threshold; attack time; release time; and mix, and wherein the at least one parameter value is used to set a value for at least one of the at least two parameters and wherein a default value is set for at least one of the at least two parameters.

9. The system of claim 8, wherein the at least one parameter value comprises at least one gain value that is used to set at least one respective gain parameter of the compression scheme, and wherein at least one remaining parameter of the compression scheme is set to a default value.

10. The system of claim 1, wherein each setting of the plurality of settings includes a label that indicates to the transcriptionist a degree to which the audio will be manipulated.

11. The system of claim 10, wherein each label relates to a magnitude of the associated at least one parameter value to be set.

12. The system of claim 1, wherein the at least one processor is configured to compress the dynamic range of at least the portion of the audio at least by increasing a loudness of sounds in the audio that is lower than a threshold.

13. The system of claim 12, wherein the at least one parameter value includes the threshold.

14. The system of claim 1, wherein the at least one processor is further configured to compress the dynamic range of the at least a portion of the audio at least by decreasing a loudness of sounds in the audio that is higher than a threshold.

15. The system of claim 14, wherein the at least one parameter value includes the threshold.

16. A method for improving understandability of audio corresponding to dictation to assist a transcriptionist in transcribing the dictation, the method comprising:
    presenting a user interface to the transcriptionist, the user interface including at least one control that can be selectively set to one of a plurality of settings;
    receiving a selection of one of the plurality of settings via the at least one control; and
    compressing a dynamic range of a loudness of sounds of at least a portion of the audio using at least one parameter value associated with the selected setting.

17. The method of claim 16, comprising compressing the dynamic range of at least the portion of the audio according to a compression scheme having a plurality of parameters, and wherein the at least one parameter value is used to set at least one value for one or more of the plurality of parameters.

18. The method of claim 16, wherein the at least one parameter value includes a gain value.

19. A non-transitory computer-readable storage medium having instructions that, when executed by at least one processor, perform a method for improving understandability of audio corresponding to dictation to assist a transcriptionist in transcribing the dictation, the method comprising:
    presenting a user interface to the transcriptionist, the user interface including at least one control that can be selectively set to one of a plurality of settings;
    receiving a selection of one of the plurality of settings via the at least one control; and
    compressing a dynamic range of a loudness of sounds of at least a portion of the audio using at least one parameter value associated with the selected setting.

20. The non-transitory computer-readable storage medium of claim 19, wherein each setting of the plurality of settings includes a label that indicates to the transcriptionist a degree to which the audio will be manipulated.

* * * * *